(12) United States Patent
Yang et al.

(10) Patent No.: US 8,779,409 B2
(45) Date of Patent: Jul. 15, 2014

(54) LOW ENERGY MEMRISTORS WITH ENGINEERED SWITCHING CHANNEL MATERIALS

(71) Applicant: Hewlett-Packard Development Company, L.P., Houston, TX (US)

(72) Inventors: Jianhua Yang, Palo Alto, CA (US); Minxian Max Zhang, Mountain View, CA (US); Gilberto Medeiros Riberio, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/629,946

(22) Filed: Sep. 28, 2012

(65) Prior Publication Data

US 2014/0091270 A1    Apr. 3, 2014

(51) Int. Cl.
*H01L 47/00* (2006.01)
(52) U.S. Cl.
USPC ................................................... 257/4; 257/2
(58) Field of Classification Search
USPC .............................................. 257/4, 2
See application file for complete search history.

(56) References Cited

U.S. PATENT DOCUMENTS

| | | | |
|---|---|---|---|
| 7,463,512 B2 | 12/2008 | Lung | |
| 7,514,705 B2 | 4/2009 | Breitwisch et al. | |
| 7,816,659 B2 | 10/2010 | Herner et al. | |
| 8,097,871 B2 | 1/2012 | Chen et al. | |
| 8,106,375 B2 * | 1/2012 | Chen et al. | 257/4 |
| 8,415,652 B2 * | 4/2013 | Yang et al. | 257/4 |
| 2011/0132745 A1 * | 6/2011 | Jou et al. | 204/192.25 |
| 2012/0032135 A1 | 2/2012 | Kuh et al. | |
| 2012/0267598 A1 * | 10/2012 | Sakotsubo et al. | 257/4 |

OTHER PUBLICATIONS

Feng, J. et al., Si Doping in Ge2Sb2Te5 Film to Reduce the Writing Current of Phase Change Memory, Applied Physics A: Materials Science & Processing, 2007, pp. 57-62, vol. 87, No. 1.

* cited by examiner

*Primary Examiner* — David Vu
*Assistant Examiner* — Brandon Fox
(74) *Attorney, Agent, or Firm* — David W. Collins (57) ABSTRACT

Low energy memristors with engineered switching channel materials include: a first electrode; a second electrode; and a switching layer positioned between the first electrode and the second electrode, wherein the switching layer includes a first phase comprising an insulating matrix in which is dispersed a second phase comprising an electrically conducting compound material for forming a switching channel.

16 Claims, 7 Drawing Sheets

LOW ENERGY MEMRISTORS WITH ENGINEERED SWITCHING CHANNEL MATERIALS

BACKGROUND

Memristors are devices that can be programmed to different resistive states by applying programming energy. After programming, the state of the memristor can be read and remains stable over a specified time period. Large crossbar arrays of memristive elements can be used in a variety of applications, including non-volatile solid state memory, programmable logic, signal processing, control systems, pattern recognition, and other applications.

DETAILED DESCRIPTION

Reference is made now in detail to specific examples of the disclosed low energy memristor and specific examples for creating the disclosed low energy memristor. Alternative examples are also briefly described as applicable.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM), for example.

The term "configurable" means either "singly configurable" or "reconfigurable".

Micron-scale dimensions refer to dimensions that range from 1 micro-meter to a few micrometers in size.

Nano-scale dimensions refer to dimensions that range from 0.1 nanometers to 500 nanometers (0.5 micrometers).

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nano-scale devices that may be used as a component in a wide range of electronic circuits, such as memories, switches, and logic circuits and systems. In a memory structure, a crossbar of memristors may be used. When used as a basis for memories, the memristor may be used to store a bit of information, 1 or 0. When used as a logic circuit, the memristor may be employed as configuration bits and switches in a logic circuit that resembles a Field Programmable Gate Array, or may be the basis for a wired-logic Programmable Logic Array. Memristors may also be configured to find uses in a wide variety of other applications, such as neuromorphic computing and implication logic.

When used as a switch, the memristor may either be a closed or open switch in a cross-point memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles whereas other memristors, such as tungsten oxide ($WO_x$)-based or titanium oxide ($TiO_x$)-based memristors, may require a sophisticated feedback mechanism for avoiding over-driving the devices or an additional step of refreshing the devices with stronger voltage pulses in order to obtain an endurance in the range of 10 million switching cycles.

Memristor devices typically may comprise two electrodes sandwiching an insulating layer. Conducting channels in the insulating layer between the two electrodes may be formed that are capable of being switched between two states, one in which the conducting channel forms a conductive path between the two electrodes ("ON") and one in which the conducting channel does not form a conductive path between the two electrodes ("OFF").

Present memristors may require too high a switching current. This may lead to shorter device lifetime, smaller crossbar array, higher energy, and heat dissipation issues, etc.

Reducing the device size, applying a current compliance or changing the switching materials (rather than engineering the channel materials) are various approaches that have been tried to solve the problem. These approaches have reduced the switching current, but not enough so far.

Thus, lowering the switching energy for present memristors is one of the major goals for applications beyond the laboratory. Engineering the switching materials, especially the active switching channel material, may be the most efficient approach.

In accordance with the teachings herein, a switching material, such as a metal oxide (e.g., $TaO_x$) may be engineered by adding a different material (e.g., $SiO_2$), which results in the formation of an electrically conducting compound phase (e.g., $Ta_2Si$), serving as the conduction channel and leading to a very low switching current. The significantly reduced switching current may lead to a long device lifetime, large array size and lower energy consumption. Further, such an approach is CMOS-compatible. The conducting compound phase may be considered to be more conductive than the insulating phase, although its conductivity may not compare with a conducting metal. Rather, the conducting compound phase is considered to be relatively conducting with respect to the insulating phase(s).

By "relatively conducting" is meant that the conducting compound phase has an electrical conductivity at least 5 times that of the insulating phase(s). In some examples, the electrical conductivity of the conducting phase may be a few orders of magnitude, or more, greater than that of the insulating phase(s).

Figure 1:
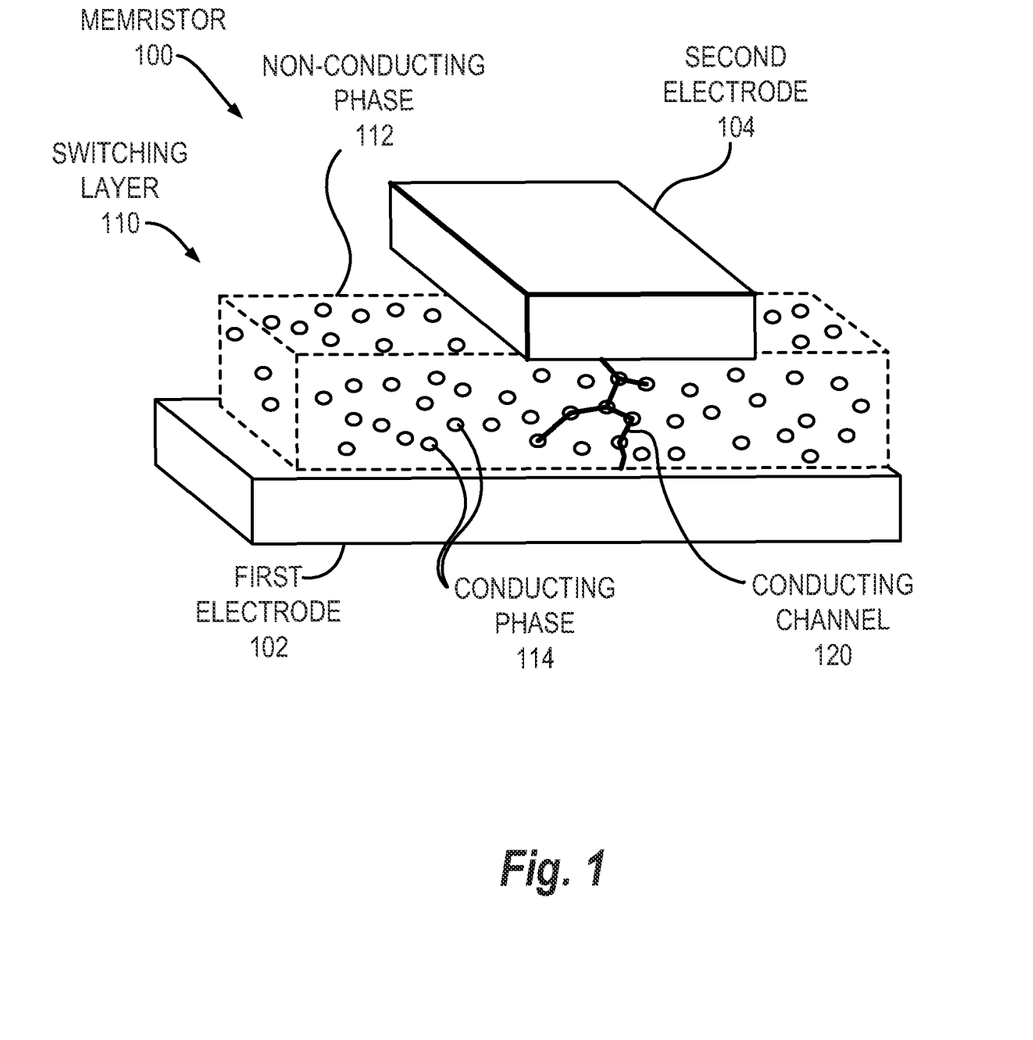
FIG. 1 is an example of a memristor device based on the principles disclosed herein.

With reference first to FIG. 1, there is shown a perspective view of a memristor 100 according to an example of principles disclosed herein. It should be understood that the memristor 100 depicted in FIG. 1 may include additional components and that some of the components described herein may be removed and/or modified without departing from a scope of the memristor 100. It should also be understood that the components depicted in FIG. 1 are not drawn to scale and thus, the components may have different relative sizes with respect to each other than as shown therein.

Generally speaking, the memristor 100 depicted in FIG. 1 may be built at the micro- or nano-scale and used as a component in a wide variety of electronic circuits. For instance, the memristor 100 may be used as the basis for memories, switches, and logic circuits and functions, such as described above.

As depicted in FIG. 1, the memristor 100 includes a first electrode 102 positioned below a second electrode 104. In addition, the first electrode 102 may be in a crossed arrangement with respect to the second electrode 104, such that the first electrode 102 is arranged substantially perpendicularly to the second electrode 104. However, it will be appreciated that in other embodiments, the first electrode 102 and the second electrode 104 may be arranged at any angle with respect to each other, depending upon the application.

One or both of the first electrode 102 and the second electrode 104 may be formed of metal or semiconductor materials. By way of particular example, both of the first electrode 102 and the second electrode 104 may be formed of, for instance, aluminum (Al), copper (Cu), platinum (Pt), tungsten (W), gold (Au), titanium (Ti), silver (Ag), ruthenium dioxide ($RuO_2$), titanium nitride (TiN), tungsten nitride ($WN_2$), tantalum (Ta), tantalum nitride (TaN) or the like. As another particular example, both the first electrode 102 and the second electrode 104 may be formed of doped silicon (Si).

The memristor 100 also includes a switching layer 110 disposed between the first electrode 102 and the second electrode 104. The switching layer 110, also called the active layer, has been shown with dashed lines to indicate that the switching layer may be relatively larger than the first electrode 102 and the second electrode 104. In other embodiments, the switching layer 110 may be relatively smaller than the first electrode 102 and the second electrode 104. In any event, the switching layer 110 is depicted as being formed of a resistive, or non-conducting, or insulating, first phase 112 that serves as an insulating matrix and a conducting, or metallic-like, second phase 114 embedded or dispersed in the resistive first phase. The material comprising the non-conducting first phase 112 may include, for instance, a transition metal oxide, such as tantalum oxide ($Ta_2O_5$), yttrium oxide ($Y_2O_3$), hafnium oxide ($HfO_2$), zirconium oxide ($ZrO_2$), etc. or a metal oxide, such as aluminum oxide ($Al_2O_3$), calcium oxide (CaO), magnesium oxide (MgO), etc.

The conducting second phase 114 may comprise a compound that is formed between the material comprising the first phase and an added material. As an example, consider the system $TaO_2:SiO_2$. This system may be resolved into $Ta_2Si:Ta_2O_5:SiO_2$. In this case, the first, insulating phase, or matrix phase, 112 is a mixture of $Ta_2O_5$ and $SiO_2$, while the second, conducting phase, or dispersed phase, 114 is $Ta_2Si$, which is dispersed in the first phase and may form a conducting channel 120. It should be noted that the first phase 112 may actually be a mixture of two (or more) insulating phases or a solid solution. For convenience, since such materials are insulating, the term "phase" when applied to the phase 112 includes both single and multiple insulating (or resistive or non-conducting or matrix) phases.

An annealing operation or other thermal forming operation, such as heating by exposure to a high temperature environment or by exposure to electrical resistance heating, may be employed to form the compound conducting channels 120. For many systems, such as Ta—O, Hf—O, Y—O, and the like, electrical resistance heating that generates an elevated temperature is sufficient to form the compound conducting channels 120 locally inside the cross-sectional area. The temperature in the localized region inside the device can be several hundred degrees higher than the rest of the materials and can therefore enhance the chemical reactions in the switching materials to form the compound conducting channels 120.

In an example, the bottom electrode 102 may be platinum having a thickness of 100 nm, the switching layer 110 may be a mixed metal oxide such as $TaO_2/SiO_2$ having a thickness of 12 nm, and the top electrode 104 may be tantalum having a thickness of 100 nm.

The switching function of the memristor 100 may be achieved in the switching layer 110. In general, the switching layer 110 is a mixture of non-metal compounds, serving as an insulating matrix 112, in which a relatively electrically compound conducting phase 114 is dispersed. More specifically, the switching layer, or active layer, is made of materials that support the formation of a relatively conducting (electrical) compound (e.g., silicides) as the conduction channel 114.

In some examples, the mixture of non-metal compounds and conducting phase may be based on a ternary system, which may be described as $M_1$-X-$M_2$, where $M_1$ is a metal such as Ta, Ti, Al, Ni, V, Sc, Y, Fe, Co, Zn, Nb, Mo, Hf, W, Zr, etc., X is a non-metal such as O, N, P, S, C, B, F, etc., and $M_2$ is a semi-metal such as Si, Ge, Ga, As, Sn, etc. Under high temperature, phase separations take place, leading to the formation of the insulating matrix 112 and compound conducting channels 120.

In some examples, the non-metal compounds may be oxides. As discussed above, an example of one such system is the ternary system Ta—O—Si, based on the oxides $TaO_2:SiO_2$. As indicated above, this system may be resolved into an electrically conductive silicide, $Ta_2Si$, and a mixture of oxides, $Ta_2O_5:SiO_2$, or simply $Ta_2Si:Ta_2O_5:SiO_2$. Examples of other systems include Mo—O—Si, based on the oxides $MoO_2:SiO_2$ (may resolve into $MoSi_2:MoO_3:SiO_2$); W—O—Si, based on the oxides $WO_2:SiO_2$ (may resolve into $WSi_2:WO_3:SiO_2$); Ti—O—Si, based on the oxides $TiO_{2-x}:SiO_2$ (may resolve into $TiSi_2:TiO_2:SiO_2$); and Nb—O—Si, based on the oxides $NbO_2:SiO_2$ (may resolve into $Nb_5Si_3:$—$Nb_2O_5:SiO_2$).

Thus, a discontinuous, relatively conducting compound second phase 114 is dispersed in a continuous relatively non-conducting (resistive) first phase 112. The formation of the combined phases may be achieved using a sputtering process, wherein the composition of the sputtering source is close to the desired film composition. For example, in the case of the Ta—O—Si system, the sputtering target may comprise 70 at % $TaO_2$ and 30 at % $SiO_2$. During sputtering, $O_2$ may be in the sputtering environment. If present, the resulting film, or switching layer 110, may have more oxygen content than the sputtering source. If $O_2$ is absent, the resulting film may have less oxygen content than the sputtering source.

In some examples, sputtering may be performed in an argon environment. Depending on the sputtering conditions, a system having the non-conducting phase 112 and the conducting phase 114 may or may not be formed. If such a system is formed, then the film 110 comprises the discontinuous conducting second phase 114 dispersed in the continuous first phase 112. If such a system is not formed, then the film that is formed may be amorphous. However, upon the first application of an electric field, localized heating takes place, and the non-conducting phase/conducting phase system is formed, with the discontinuous second phase 114 dispersed in the continuous first phase 112. In either case, the first application of the electric field may form the conducting channels 120. The sputtering deposition conditions control the morphology of the film, and may require some experimentation. The typical variables are the substrate temperature, the gas environment, the deposition rate, etc. However, for persons skilled in this art, such experimentation is not considered undue, based on the disclosure herein.

As shown in FIG. 1, the conducting channel 120 is formed in the switching layer 110 at a junction between the first electrode 102 and the second electrode 104. While one conducting channel 120 is shown (and described herein), it will be appreciated that a number of such conducting channels may form during the heating process, some of which (or at least one of which) may extend from the first electrode 102 to the second electrode 104 and others of which may terminate at one or both ends within the matrix comprising the non-conducting first phase 112.

Figure 1A:
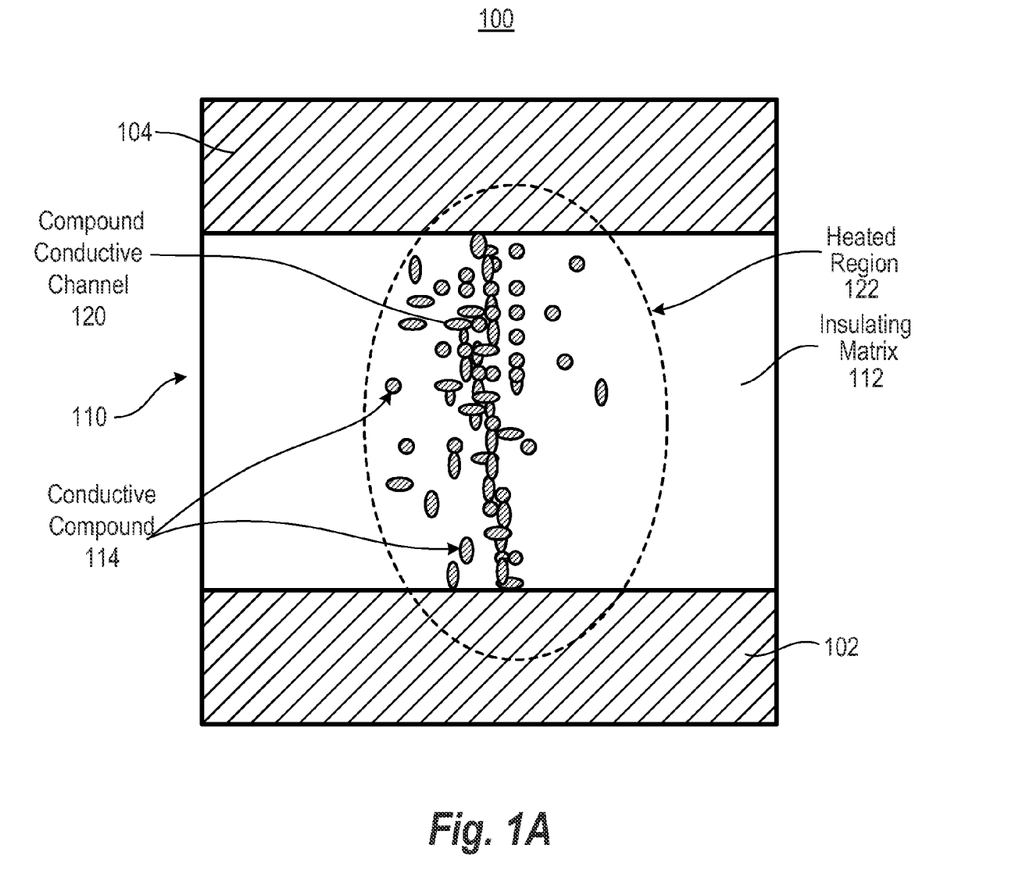
FIG. 1A is schematic diagram of FIG. 1, illustrating the formation of a heated region that results in the creation of a conducting channel.

FIG. 1 should be understood as being schematic only. Without subscribing to any particular theory, it appears that the conductive compound phase only forms around a localized region where heating (mainly joule heating) occurs. Within that heated region, more and more conductive compound particles come out to eventually form one or more conducting channel(s) 120. FIG. 1A may depict a somewhat more accurate representation, in which the conductive compounds 114, having been formed by chemical reactions under elevated temperature, align in the presence of heat and form the compound conductive channel 120 within a heated region 122.

The conducting channel 120 may be formed through a localized atomic modification and chemical reactions in the switching layer 110 caused by the annealing or other thermal forming process. Examples of channel formation may include ambient heating, resistive heating (application of an electric field), laser heating, etc. By way of particular example in which the switching material 112 comprises a mixture of $Ta_2O_5$ and $SiO_2$ and the conducting phase 114 comprises $Ta_2Si$, during the thermal forming process, regions of the conducting phase 114 may coalesce to form at least one conducting channel 120.

These conducting channel(s) 120 may be responsible for the sub-sequent switching in the memristor 100. Without subscribing to any particular theory, it appears that one channel usually becomes the dominant path. During the switching operation, the atoms (anions or cations) that make up the conducting phase 114 are configured to move in an electric field conducted through the conducting channel(s) 120 to open or close a gap inside the conducting channel(s) 120, which may be read to determine whether the memristor 100 is in an OFF or ON state, respectively.

The conducting channel(s) 120 are referred to herein as the active region of the memristor 100. In one regard, the conductivity of the conducting channel(s) 120 may be modulated by applying different biases across the first electrode 102 and the second electrode 104. Thus, the memristor 100 may be reconfigurable based upon the bias applied across the first electrode 102 and the second electrode 104. In other instances, however, the switching layer 110 may be formed to be singly configurable.

To determine appropriate oxide systems that may be employed in the practice of the invention, an inspection of a selected phase diagram is done. In particular, both a conducting region and an insulating region are desired, and a composition is selected that includes a combination of at least one insulating material and at least one conducting material.

As noted above, in many examples, one conducting phase and two (mixed) insulating phases may be employed; a suitable example, described above, would be:

$Ta_2Si$—conduction channel; and
$Ta_2O_5$:$SiO_2$—insulating matrix.

In some examples, the mixture of oxides may be two conducting phases (e.g., one of the oxide phases is conducting, such as $Ti_4O_7$ or $RuO_2$) and one insulating phase. In the Ti—O—Si and the Nb—O—Si systems, depending on the compositions, two conducting phases and one insulating phase may exist:

Ti—O—Si:$Ti_4O_7$:$TiSi_2$:$SiO_2$
Nb—O—Si:$NbO_2$:$Nb_5Si_3$:$SiO_2$.

While $M_1$-O—Si systems have been described above, Ge may work in the same way as Si. Thus, the system Ta—O—Ge may be resolved into $Ta_2Ge$:$Ta_2O_5$:$GeO_2$.

While not subscribing to any particular theory, it appears that the formation of a compound, such as a silicide, as the conduction channel is favored over the formation of a pure metal, such as Ta, as the conduction channel 120. Essentially, less Gibbs energy is involved in the redox of a silicide (e.g., $Ta_2Si$) as a channel material than in the redox of a pure metal (e.g., Ta). This may result in lower switching energy for memristors constructed in accordance with the teachings herein.

As previously discussed, an example of a ternary system suitably employed in the practice of the present teachings is Ta—O—Si. The phase diagram 200 of this system is presented in FIG. 2. The binary compounds $Ta_2O_5$, $SiO_2$, $Ta_2Si$, and $TaSi_2$ are depicted, as well as tie lines connecting them. A "target" composition 202 is depicted along dashed line 204. Such a composition is the composition of the sputtering target used to form the ternary oxide phases, and may comprise, for example, 70 at % $TaO_2$ and 30 at % $SiO_2$.

Figure 2:
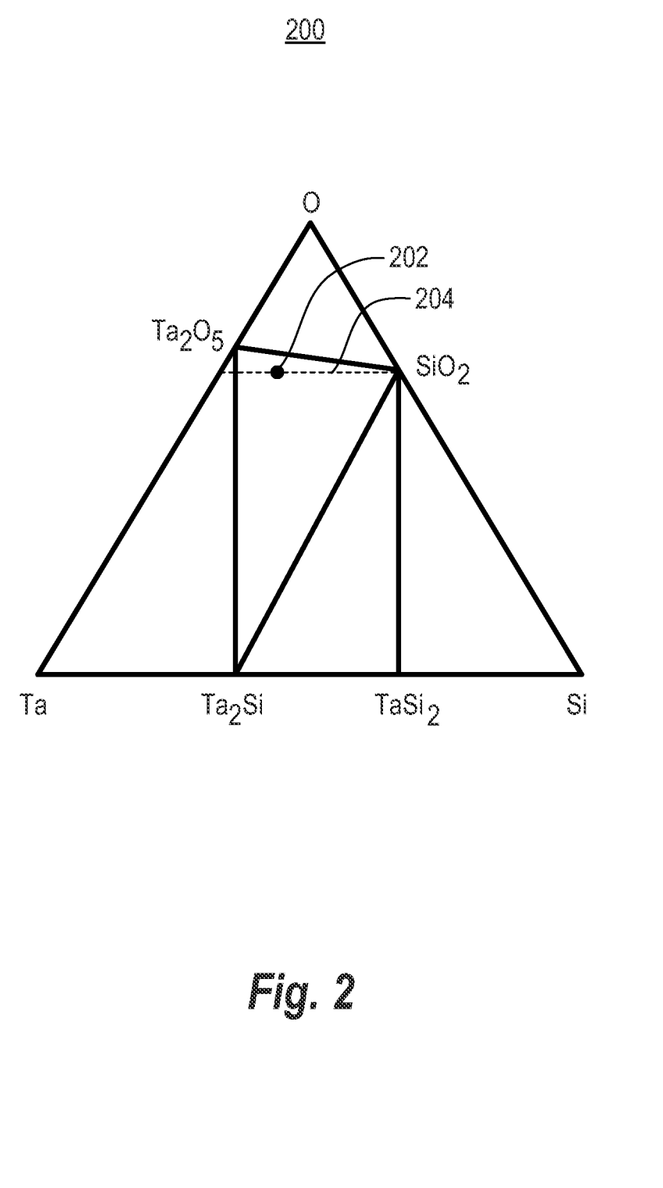
FIG. 2 is a ternary phase diagram of the Ta—Si—O system, useful in the practice of the various examples disclosed herein.

Sputtering from such a target may form a film that will decompose upon heating into two insulating phases, $Ta_2O_5$ and $SiO_2$, and a relatively conducting phase, $Ta_2Si$. By increasing the amount of $Ta_2Si$ phase, such as by application of heat, a conducting channel of $Ta_2Si$ forms. The redox reaction of this compound channel(s) under electrically bias results in the low energy memristive switching.

In the system Ta—O—Si, forming the $Ta_2O_5$:$SiO_2$ insulating matrix and the $Ta_2Si$ conducting channel, also results in a reduced leakage current from the insulating matrix. This is because the $SiO_2$ and $Ta_2O_5$ mixed matrix is more resistive than a pure $Ta_2O_5$ matrix, due to the fact that $SiO_2$, with a larger bandgap, is more resistive than $Ta_2O_5$. Reduced leakage current in the device leads to a larger resistance in the OFF state and thus a larger OFF/ON resistance ratio. Lower leakage current also reduces the operation power.

Figure 3A:
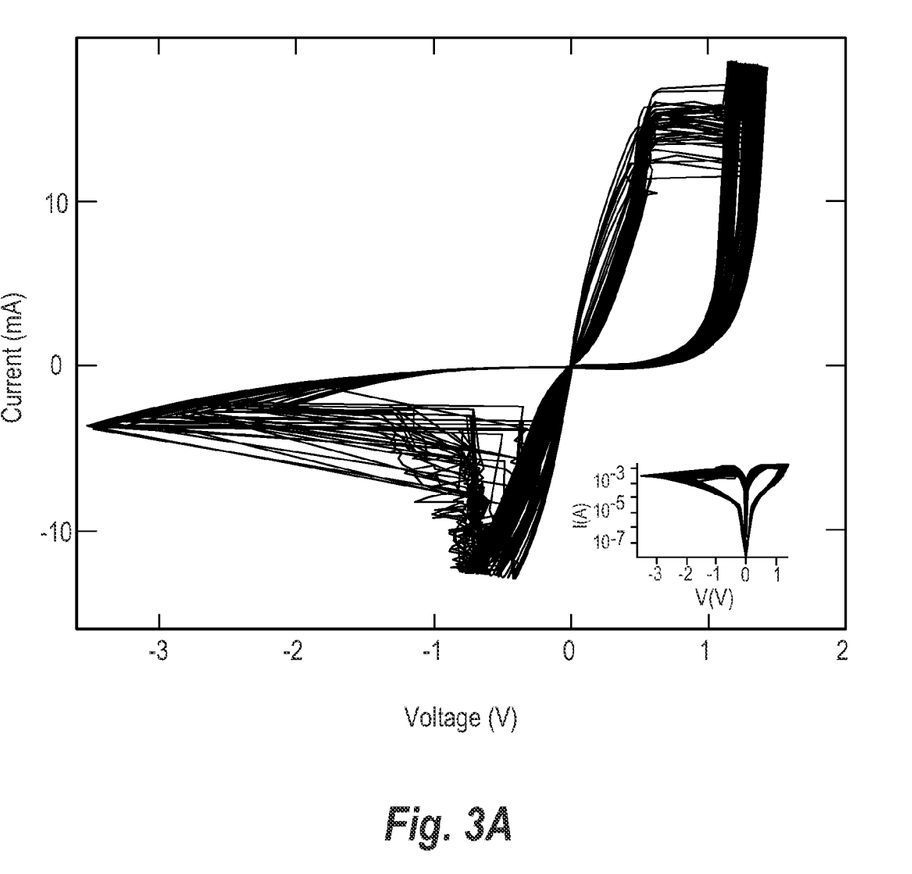
FIGS. 3A-3C, each on coordinates of current (in μA) and voltage (in V), provide a comparison of switching currents for a $TiO_x$ device (FIG. 3A), a $TaO_x$ device (FIG. 3B), and an example of a $TaO_2$—$SiO_2$ device (FIG. 3C) in accordance with principles disclosed herein.
Figure 3B:
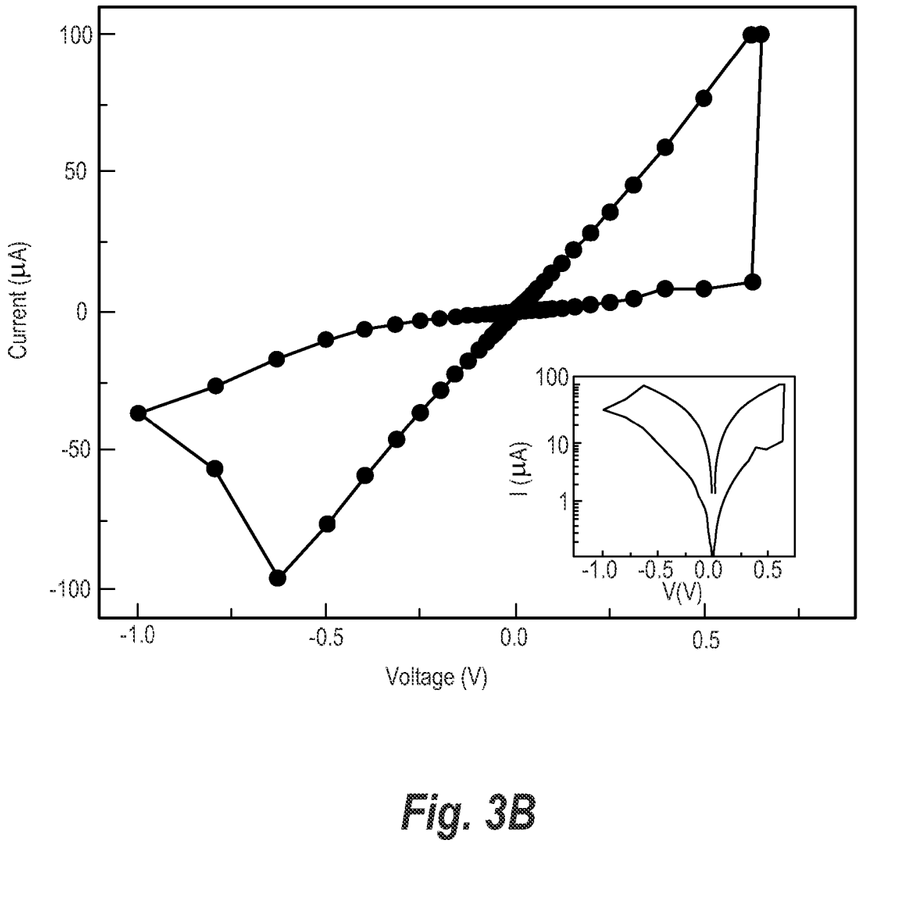
Figure 3C:
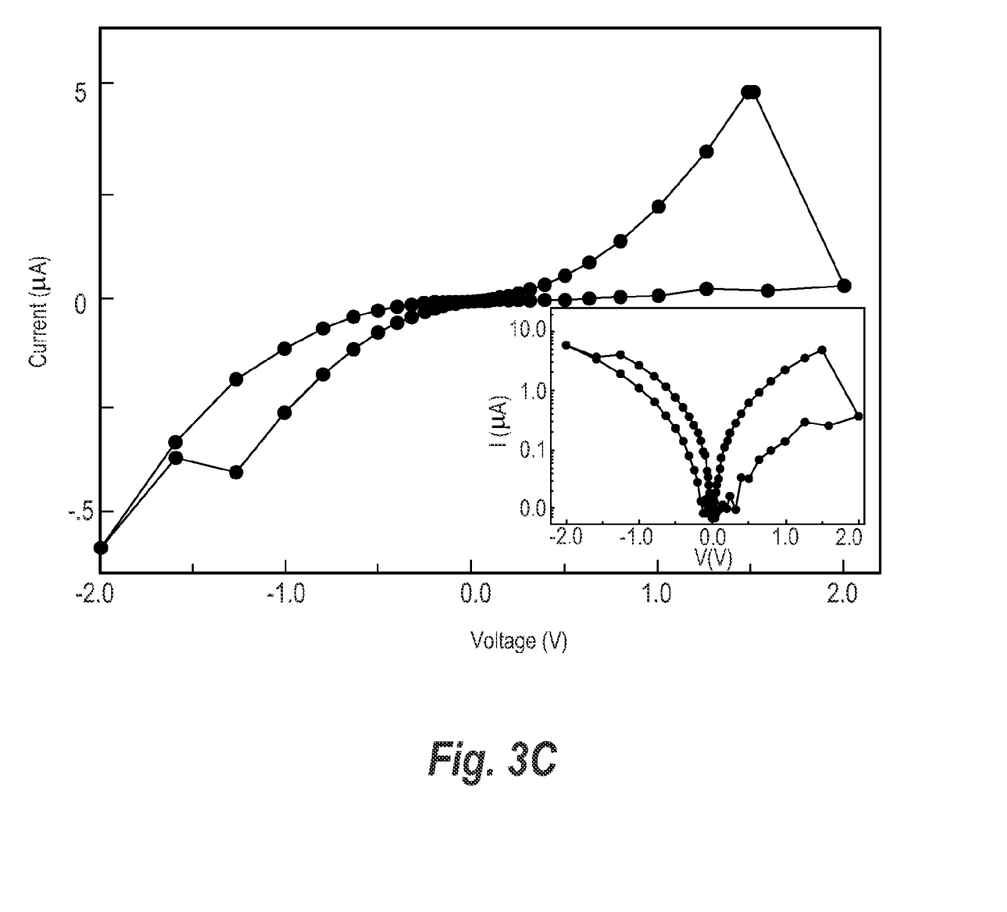

FIGS. 3A, 3B, and 3C are I-V plots that provide a comparison of switching currents for a TiOx device (FIG. 3A), a $TaO_x$ device (FIG. 3B), and a $(TaO_2)_{0.7}(SiO_2)_{0.3}$ device in accordance with the present teachings (FIG. 3C). The insert in each Figure shows the same information, but where current is depicted on a logarithm scale.

In FIG. 3A, the I-V plot is for a $TiO_x$ device having dimensions of 5 μm×5 μm. The plot indicates 15 mA, linear current-voltage in the ON state.

In FIG. 3B, the I-V plot is for a $TaO_x$ device having a diameter of 100 μm. The plot indicates about 100 μA, linear current-voltage in the ON state, or about 150 times better than the $TiO_x$ device.

In FIG. 3C, the I-V plot is for a $(TaO_2)_{0.7}(SiO_2)_{0.3}$ device also having a diameter of 100 μm. The plot indicates about 5 μA, nonlinear current-voltage in the ON state. The current is about 20 times better than the $TaO_x$ device and about 3000 times better than the $TiO_x$ device. Lower switching current results in lower operation energy and longer device lifetime.

Figure 4:
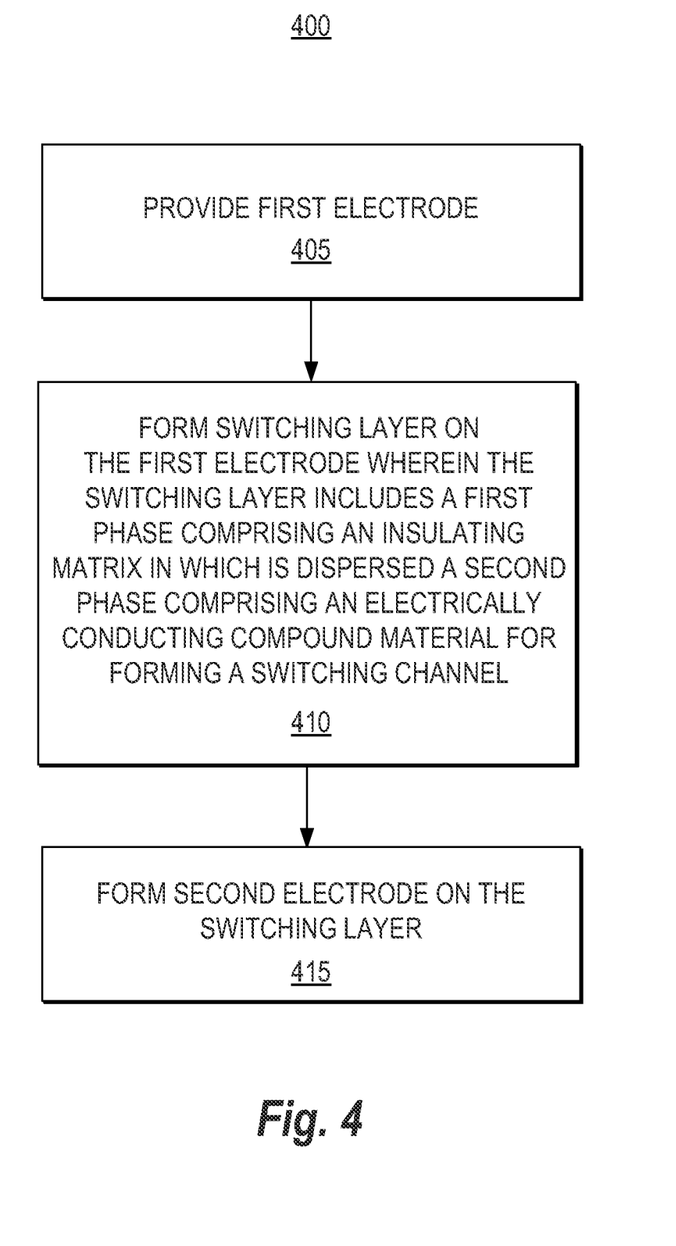
FIG. 4 is a flow chart depicting an example method for fabricating a memristor in accordance with the examples disclosed herein.

FIG. 4 depicts an example process 400 for forming low energy memristors with engineered switching channel materials.

The process 400 includes providing 405 the first electrode 102. such as by sputtering, evaporation, ALD (atomic layer deposition), co-deposition, chemical vapor deposition, IBAD (ion beam assisted deposition), or any other film deposition technology. The thickness of the first electrode 102 may be in the range of about 50 nm to a few micrometers.

The process further includes forming 410 the switching layer 110 on the first electrode 102. As described above, the switching layer 110 may be decomposed upon heating into a first phase 112 of an insulating matrix and a second phase 114 of an electrically conducting compound dispersed in the first phase. As described above, the switching layer 110 may be deposited by sputtering. Other methods of depositing the switching layer 110 include, but are not limited to, atomic layer deposition, chemical vapor deposition, evaporation, co-sputtering (using two metal oxide targets, for example), or other such process. The thickness of the active region 110 may be approximately 4 to 50 nm.

The process additionally includes forming 415 the second electrode 104 on the switching layer 110. The electrode 104 may be provided through any suitable formation process, such as described above for forming the first electrode 102. In some examples, more than one electrode may be provided. The thickness of the second electrode 104 may be in the range of about 50 nm to a few micrometers.

In some examples, a switching channel 120 may be formed. In an example, the switching channel is formed by heating the active region 110. Heating can be accomplished using many different processes, including thermal annealing or running an electrical current through the memristor. In other examples, wherein a forming-free memristor with built-in conductance channels is used, no heating may be required as the switching channels are built in and the application of the first voltage, which may be approximately the same as the operating voltage, to the virgin state of the memristor 100 may be sufficient for forming the switching channel 120.

The sequence of the formation of the bottom and top electrodes 102, 104 may be changed in some cases.

What is claimed is:

1. Low energy memristors with engineered switching channel materials
including:
   a first electrode;
   a second electrode; and
   an switching layer positioned between the first electrode and the second electrode, wherein the switching layer includes a first phase comprising an insulating matrix in which is dispersed a second phase comprising an electrically conducting compound material for forming a switching channel, where in the second phase includes a metal-semi-metal binary compound.

2. The memristor of claim 1, wherein the mixture of insulating matrix and conducting phase is based on a ternary system, $M_1$-X-$M_2$, where $M_1$ is the metal, which is selected from the group consisting of Ta, Ti, Al, Ni, V, Sc, Y, Fe, Co, Zn, Nb, Mo, Hf, W, and Zr, X is a non-metal selected from the group consisting of O, N, P, S, C, B, and F, and $M_2$ is the semi-metal, which is selected from the group consisting of Si, Ge, Ga, As, and Sn.

3. The memristor of claim 2, wherein the non-metal compounds are oxides.

4. The memristor of claim 3, wherein the ternary system is selected from the group consisting of Ta—O—Si, Mo—O—Si, W—O—Si, Ti—O—Si, Nb—O—Si, and Ta—O—Ge.

5. The memristor of claim 4, wherein the ternary system resolves into either a system selected from the group of systems:
   $Ta_2Si:Ta_2O_5:SiO_2$;
   $MoSi_2:MoO_3:SiO_2$;
   $WSi2:WO3:SiO2$;
   $TiSi2:TiO2:SiO2$;
   $Nb_5Si_3:Nb_2O_5:SiO_2$; and
   $Ta_2Ge:Ta_2O_5:GeO_2$,
   wherein the first compound in each list comprises the conducting second phase,
   or a system selected from the group of systems:
   $Ti_4O_7:TiSi_2:SiO_2$; and
   $NbO_2:Nb_5Si_3:SiO_2$,
   wherein the first two compounds in each list comprise the conducting second phase.

6. The memristor of claim 1, wherein the switching channel is singly configurable.

7. The memristor of claim 1, wherein the switching channel is reconfigurable.

8. A process for forming low energy memristors with engineered switching channel materials,
   the low energy memristors including:
      a first electrode;
      a second electrode; and
      a switching layer positioned between the first electrode and the second electrode, wherein the switching layer includes a first phase comprising an insulating matrix in which is dispersed a second phase comprising an electrically conducting compound material for forming a switching channel, wherein the second phase includes a metal-semi-metal binary compound,
   the process comprising:
      providing the first electrode;
      forming the switching layer on the first electrode; and
      forming the second electrode on the switching layer.

9. The process of claim 8, further comprising forming the switching channel in the switching layer.

10. The process of claim 9, wherein the switching channel is formed by a thermal process.

11. The process of claim 8, wherein the insulating matrix and conducting phase is based on a ternary system, $M_1$-X-$M_2$, where $M_1$ is the metal, which is selected from the group consisting of Ta, Ti, Al, Ni, V, Sc, Y, Fe, Co, Zn, Nb, Mo, Hf, W, and Zr, X is a non-metal selected from the group consisting of O, N, P, S, C, B, and F, and $M_2$ is the semi-metal, which is selected from the group consisting of Si, Ge, Ga, As, and Sn.

12. The process of claim 11, wherein the non-metal compounds are oxides.

13. The process of claim 11, wherein the ternary system is selected from the group consisting of Ta—O—Si, Mo—O—Si, W—O—Si, Ti—O—Si, and Nb—O—Si, and Ta—O—Ge.

14. The process of claim 13, wherein the ternary system resolves into either a system selected from the group of systems:

$Ta_2Si:Ta_2O_5:SiO_2$;
$MoSi_2:MoO_3:SiO_2$;
$WSi2:WO3:SiO2$;
$TiSi2:TiO2:SiO2$;
$Nb_5Si_3:Nb_2O_5:SiO_2$; and
$Ta_2Ge:Ta_2O_5:GeO_2$,
wherein the first compound in each list comprises the conducting second phase,
or a system selected from the group of systems:
$Ti_4O_7:TiSi_2:SiO_2$; and
$NbO_2:Nb_5Si_3:SiO_2$,
wherein the first two compounds in each list comprise the conducting second phase.

15. The process of claim 8, wherein the switching channel is singly configurable.

16. The process of claim 8, wherein the switching channel is reconfigurable.

* * * * *

UNITED STATES PATENT AND TRADEMARK OFFICE
CERTIFICATE OF CORRECTION

| | |
|---|---|
| PATENT NO. | : 8,779,409 B2 |
| APPLICATION NO. | : 13/629946 |
| DATED | : July 15, 2014 |
| INVENTOR(S) | : Jianhua Yang et al. |

It is certified that error appears in the above-identified patent and that said Letters Patent is hereby corrected as shown below:

Title page, item (72), Inventors, in column 1, line 3, delete "Riberio," and insert -- Ribeiro, --, therefor.

In the Claims

In column 8, line 2, in Claim 1, delete "where in" and insert -- wherein --, therefor.

Signed and Sealed this
Sixth Day of January, 2015

Michelle K. Lee
*Deputy Director of the United States Patent and Trademark Office*